(12) United States Patent
Shin

(10) Patent No.: US 7,791,963 B2
(45) Date of Patent: Sep. 7, 2010

(54) SEMICONDUCTOR MEMORY DEVICE AND OPERATION METHOD THEREOF

(75) Inventor: Beom-Ju Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 290 days.

(21) Appl. No.: 12/154,937

(22) Filed: May 28, 2008

(65) Prior Publication Data

US 2009/0219770 A1    Sep. 3, 2009

(30) Foreign Application Priority Data

Feb. 29, 2008    (KR) .............................. 2008-0018763

(51) Int. Cl.
*G11C 7/00* (2006.01)
(52) U.S. Cl. .................. 365/191; 365/233; 365/201
(58) Field of Classification Search ................ 365/191, 365/233, 201, 189.05, 230.03, 230.05, 189.03, 365/189.04
See application file for complete search history.

(56) References Cited

U.S. PATENT DOCUMENTS 7,027,336 B2 * 4/2006 Lee ............................. 365/194

2008/0056019 A1 * 3/2008 Kim et al. .............. 365/189.05

FOREIGN PATENT DOCUMENTS

| KR | 10-2005-0041613 | 5/2005 |
| KR | 10-0543937 B1 | 1/2006 |
| KR | 10-2006-0075060 | 7/2006 |
| KR | 10-0744004 B1 | 7/2007 |

* cited by examiner

*Primary Examiner*—Dang T Nguyen
(74) *Attorney, Agent, or Firm*—Blakely, Sokoloff, Taylor & Zafman LLP

(57) ABSTRACT

Semiconductor memory device and operation method thereof includes an output enable signal generator configured to synchronize a read command to a data clock signal to generate an output enable signal according to a CAS latency, a sampling control signal generator configured to generate a sampling control signal that is activated during a period corresponding to an activation timing of the output enable signal and an end timing of data output, a read clock signal generator configured to sample the data clock signal in response to the sampling control signal to generate a read clock signal and a data output circuit configured to output data according to the read clock signal.

26 Claims, 11 Drawing Sheets

SEMICONDUCTOR MEMORY DEVICE AND OPERATION METHOD THEREOF

CROSS-REFERENCE TO RELATED APPLICATIONS

The present invention claims priority of Korean patent application number 10-2008-0018763, filed on Feb. 29, 2008, which is incorporated by reference in its entirety.

BACKGROUND OF THE INVENTION

The present invention relates to a semiconductor memory device, and more particularly, to a semiconductor memory device that can operate at a low power by reducing power consumption of a toggling clock signal.

A semiconductor memory device such as a double data rate synchronous DRAM (DDR SDRAM) receives data from a source external to the device in response to an external clock signal, and outputs internal data to the outside in response to an internal clock signal. That is, the semiconductor memory device processes data using the internal clock signal, not the external clock signal, in the output mode. In other words, data input in synchronization with the external clock signal is output in synchronization with the internal clock signal. Such a change of clock signal from one to another is referred to as "domain crossing."

A lot of circuits are included in the semiconductor memory device to allow the domain crossing. An output enable signal generator is a representative example. The output enable signal generator allows data transferred in synchronization with an internal clock signal to output in synchronization with an external clock signal after a column address strobe (CAS) latency.

A DDR product and a DDR2 product include a delay locked loop (DLL) for generating a DLL clock signal, and use the generated DLL clock signal to output data. However, a recently developed GDDR5 product, which are mostly used in a graphic memory, uses a clock signal, WCLK (hereinafter, referred to as 'write/read clock signal'), instead of the DLL clock signal. For reference, the GDDR5 product receives an HCLK (hereinafter, referred to as 'host clock signal') and the write/read clock signal from an external device. The host clock signal is used in operations related to an external command, an address, and a core, and the write/read clock signal is used in both a read operation and a write operation of the semiconductor memory device. Generally, a frequency of the write/read clock signal is two times higher than that of the host clock signal. The write/read clock signal and the host clock signal are defined in the specification.

FIG. 1 is a block diagram of a conventional semiconductor memory device.

Referring to FIG. 1, the semiconductor memory device includes a frequency dividing circuit 110, a buffer circuit 130, an output enable signal generation circuit 150, and a data output circuit 170.

The frequency dividing circuit 110 divides a write/read clock signal WCLK to generate a data clock signal WCLK/2. In general, the frequency dividing circuit 110 divides the write/read clock signal WCLK in half to generate the data clock signal WCLK/2. For reference, the data clock signal WCLK/2 has the same frequency as a host clock signal HCLK.

The buffer circuit 130 buffers the data clock signal WCLK/2 to generate a read clock signal CLK_RD. The read clock signal CLK_RD has nearly the same frequency as the data clock signal WCLK/2.

The output enable signal generation circuit 150 receives a read command RD, a CAS latency CL, the host clock signal HCLK, and the data clock signal WCLK/2 to generate an output enable signal OE. The output enable signal generation circuit 150 synchronizes the read command RD to the data clock signal WCLK/2 to output the output enable signal OE according to the CAS latency CL. Here, the read command is generated by decoding an external command received from an external device, and is synchronized to the host clock signal HCLK. The CAS latency has information about a time for outputting data after receipt of the read command RD. The CAS latency is set by a mode register set. The output enable signal OE is synchronized to the data clock signal WCLK/2.

The data output circuit 170 receives an internal data DAT_IN to output an external data DAT_OUT in response to the output enable signal OE.

Circuits of the frequency dividing circuit 110, the buffer circuit 130, the output enable signal generation circuit 150, and the data output circuit 170 are well known to those skilled in the art. Therefore, detail circuits thereof will be omitted herein.

FIG. 2 is a timing diagram illustrating a read operation of the conventional semiconductor memory device of FIG. 1.

FIG. 2 shows waveforms of the data clock signal WCLK/2, the output enable signal OE, a read clock signal CLK_RD, a data control signal POUT_CL3, and the external data DAT_OUT. For reference, the data control signal POUT_CL3 is generated by the data output circuit 170.

As the read command RD is applied, the output enable signal OE is activated according to the CAS latency CL. In the embodiment, the output enable signal OE is activated at −4 clock from the CAS latency. This may be different according to a design of the semiconductor memory device. The read clock signal CLK_RD is a toggling clock signal. The output enable signal OE is synchronized to the read clock signal CLK_RD to generate a data control signal POUT_CL3. After the activation of the data control signal POUT_CL3, the internal data DAT_IN in FIG. 1 is output as an external data DAT_OUT in response to the read clock signal CLK_RD. Here, the data DATA is output 2 clocks after the activation of the data control signal POUT_CL3. This may also be different according to the design of the semiconductor memory device. Because a burst length is set to 8, eight data are output in response to the read clock signal CLK_RD.

Recently, the semiconductor memory device is designed to improve speed and reduce power consumption. To improve the speed, frequency of the toggling clock signal in the semiconductor memory device increases gradually. However, the clock signal toggling at high frequency increases power consumption. Especially, although the read clock signal CLK_RD is directly related to the data output, the read clock signal CLK_RD continuously toggles out of the period required to output data. In addition, because the read clock signal CLK_RD toggles during operations, such as a precharging operation, other than the read operation, extremely great power is consumed. As the number of data pads increases, the read clock signal CLK_RD is used more frequently. Therefore, the power consumption increases further.

SUMMARY OF THE INVENTION

Embodiments of the present invention are directed to providing a semiconductor memory device that can control an unnecessary toggling of a clock signal to reduce power consumption.

In accordance with an aspect of the present invention, there is provided an output enable signal generation circuit configured to synchronize a read command to a data clock signal to generate an output enable signal according to a CAS latency, a sampling control signal generation circuit configured to generate a sampling control signal that is activated during a period corresponding to an activation timing of the output enable signal and an end timing of data output, a read clock signal generation circuit configured to sample the data clock signal in response to the sampling control signal to generate a read clock signal and a data output circuit configured to output data according to the read clock signal.

DESCRIPTION OF SPECIFIC EMBODIMENTS

Hereinafter, a semiconductor memory device and an operation method thereof in accordance with the present invention will be described in detail with reference to the accompanying drawings.

Figure 1:
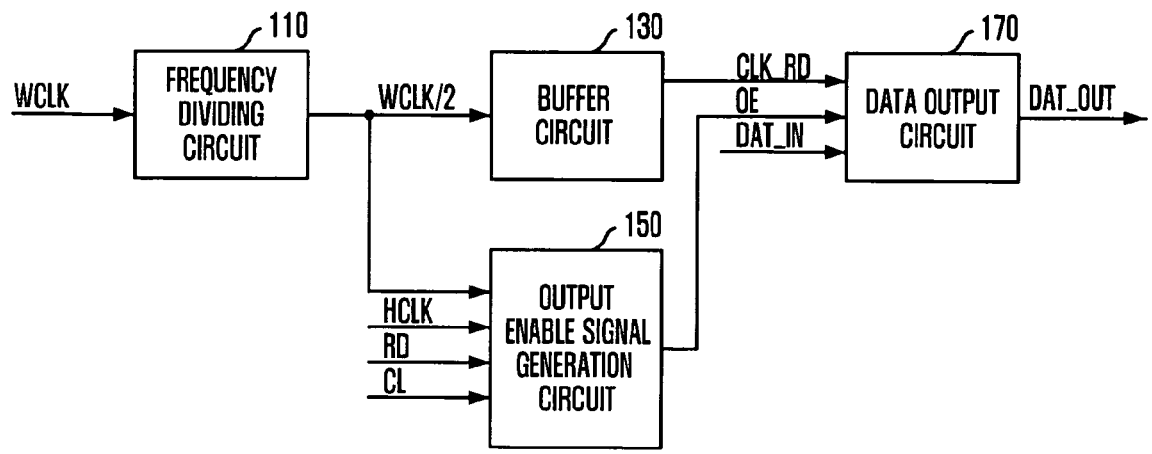
FIG. 1 is a block diagram of a conventional semiconductor memory device.
Figure 2:
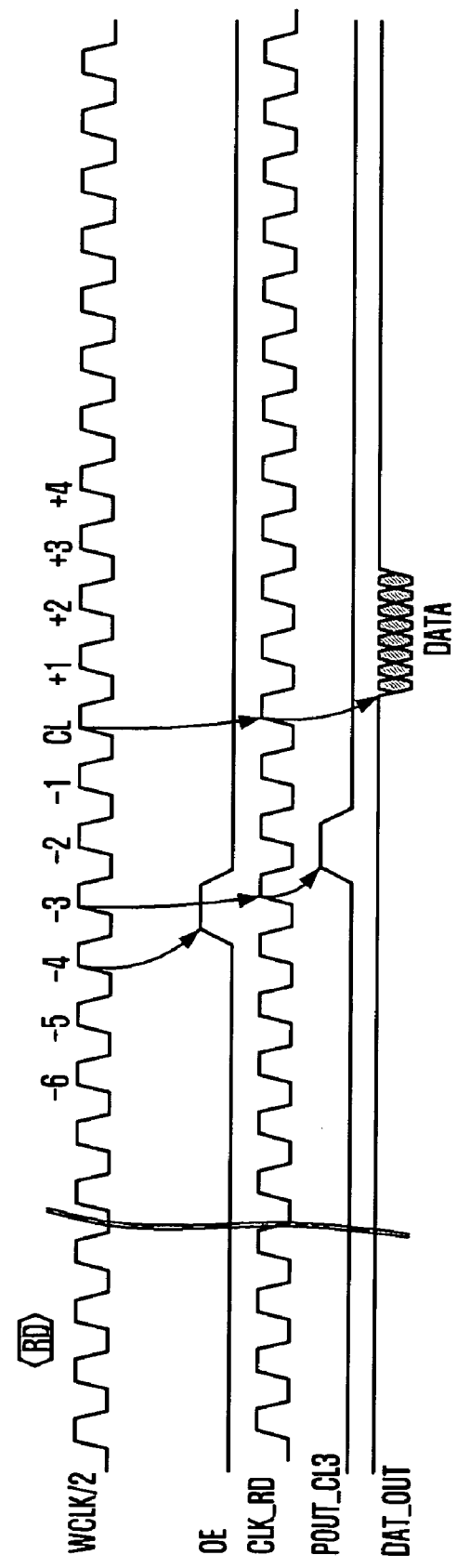
FIG. 2 is a timing diagram illustrating a read operation of the conventional semiconductor memory device of FIG. 1.
Figure 3:
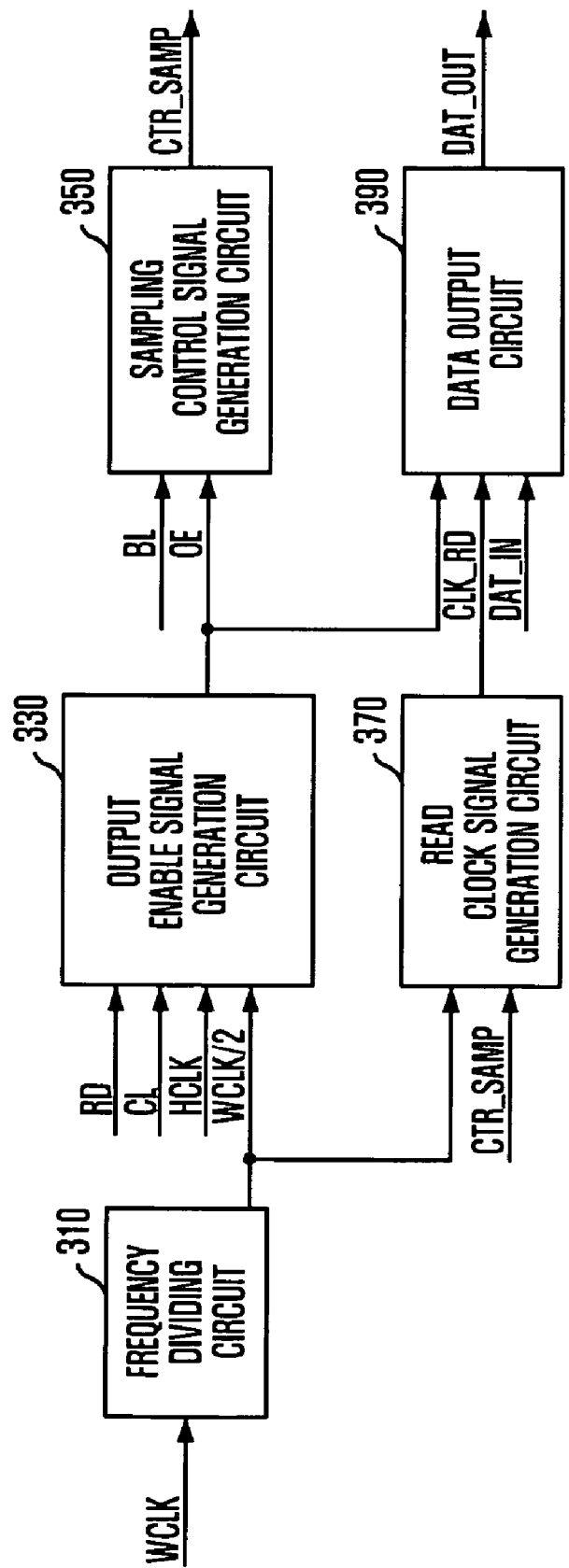
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device includes a frequency dividing circuit 310, an output enable signal generation circuit 330, a sampling control signal generation circuit 350, a read clock signal generation circuit 370, and a data output circuit 390.

The frequency dividing circuit 310 divides a write/read clock signal WCLK to generate a data clock signal WCLK/2. In general, the frequency dividing circuit 110 divides the write/read clock signal WCLK in half to generate the data clock signal WCLK/2. For reference, the data clock signal WCLK/2 has the same frequency as a host clock signal HCLK.

The output enable signal generation circuit 330 receives a read command RD, a CAS latency CL, the host clock signal HCLK, and the data clock signal WCLK/2 to generate an output enable signal OE. Here, the read command is generated by decoding an external command received from an external device, and is synchronized to the host clock signal HCLK. The CAS latency includes information about a time for outputting data after receipt of the read command RD. The CAS latency may be provided by a mode register set. Therefore, the output enable signal generation circuit 330 receives the read command RD in synchronization with the host clock signal HCLK, and synchronizes the read command RD to the data clock signal WCLK/2 to generate the output enable signal OE according to the CAS latency CL.

The sampling control signal generation circuit 350 generates a sampling control signal CTR_SAMP, which is activated for a duration from the activation of the output enable signal OE to the end of the data output. The end time of the data output can be set in terms of a burst length BL. The burst length may also be provided by the mode register set, like the CAS latency CL. The sampling control signal CTR_SAMP is a pulse signal activated in response to the output enable signal OE and deactivated at the end time of the data output. The sampling control signal CTR_SAMP is a pulse signal activated during a period required to output data.

The read clock signal generation circuit 370 performs sampling of the data clock signal WCLK/2 during an activation period of the sampling control signal CTR_SAMP to generate a read clock signal CLK_RD. The read clock signal CLK_RD toggles during the activation period of the sampling control signal CTR_SAMP. Because the read clock signal CLK_RD toggles during the period required to output data, power consumption can be reduced relatively to the conventional semiconductor memory device.

The data output circuit 390 outputs the internal data DAT_IN as an external data DAT_OUT in response to the read clock signal CLK_RD. Here, the length of the external data DAT_OUT can be controlled by the setting of the burst length BL. The sampling control signal CTR_SAMP has information about the burst length BL as well as information about the activation timing of the output enable signal OE, and thus the data processing operation identical to the conventional one can also be performed. For reference, the data output circuit 390 synchronizes the output enable signal OE to the read clock signal CLK_RD to generate a data control signal POUT_CL3 in FIG. 4, internally. The data control signal POUT_CL3 controls operations required to output data.

Figure 4:
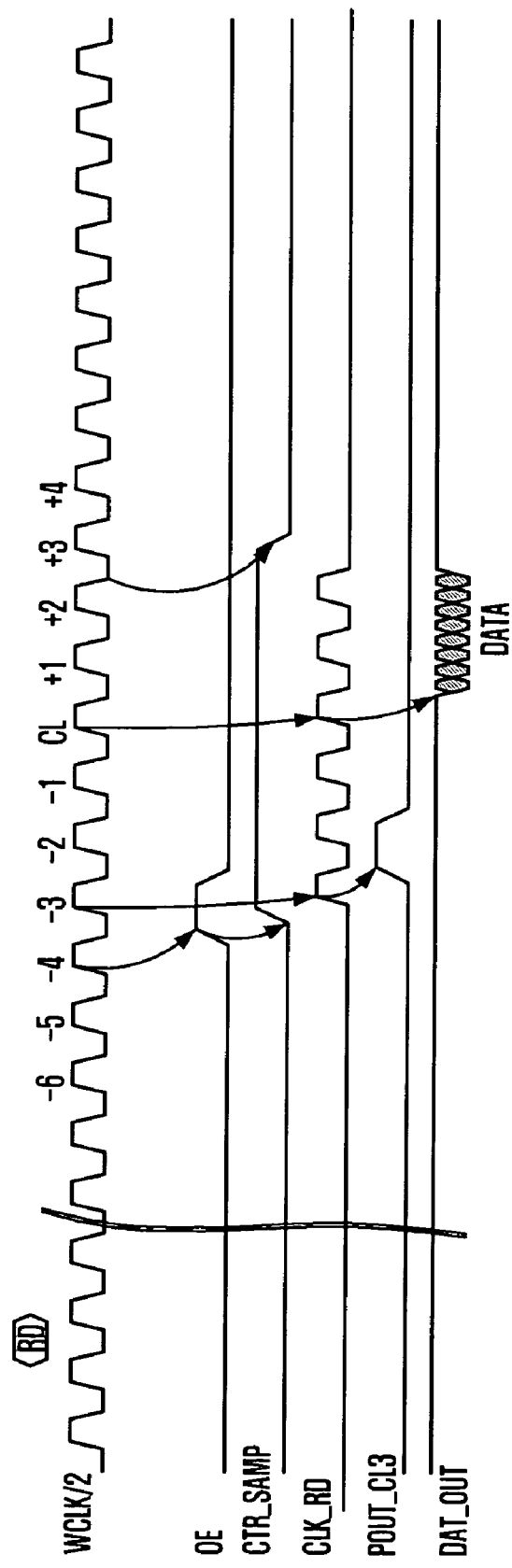
FIGS. 4 and 5 are timing diagrams illustrating waveforms of signals during a read operation of a semiconductor memory device in accordance with an embodiment of the present invention.
Figure 5:
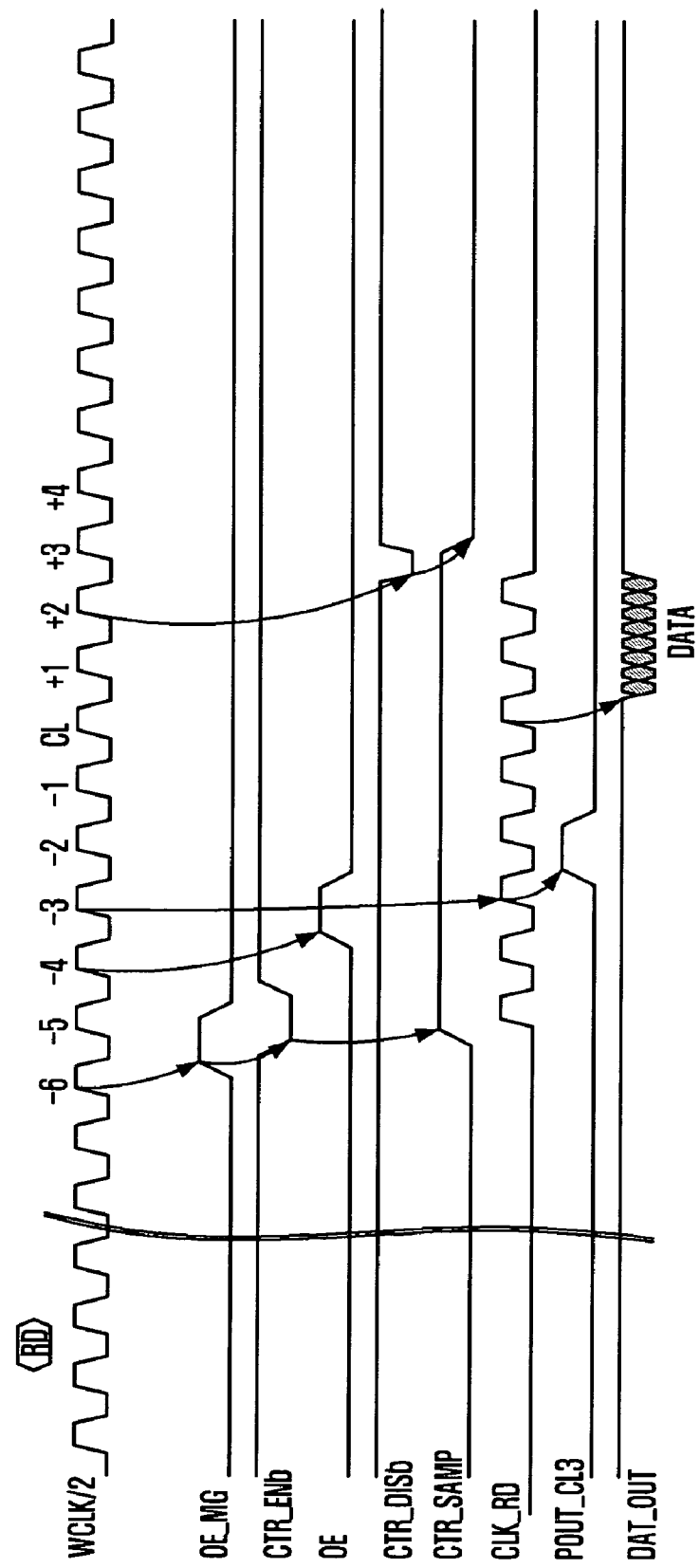

FIGS. 4 and 5 are timing diagrams illustrating waveforms of signals during a read operation of a semiconductor memory device in accordance with an embodiment of the present invention.

FIG. 4 shows waveforms of a data clock signal WCLK/2, an output enable signal OE, a sampling control signal CTR_SAMP, a read clock signal CLK_RD, a data output signal POUT_CL3, and an external data DAT_OUT.

As a read command is applied, the output enable signal OE is activated according to a CAS latency CL. In the embodiment, the output enable signal OE is activated at −4 clocks from the CAS latency CL, like the conventional case. This may be different according to a design of the semiconductor memory device. Here, an activation period of the sampling control signal may be set according to the output enable signal OE and a burst length BL in FIG. 3.

Then, the read clock signal CLK_RD is a signal obtained by sampling the data clock signal WCLK/2 during an activation period of the sampling control signal CTR_SAMP. Consequently, the read clock signal CLK_RD toggles only during the period required to output a data DATA. Meanwhile, the output enable signal OE is synchronized to the read clock signal to generate the data control signal POUT_CL3. After the activation of the data control signal POUT_CL3, an internal data DAT_IN in FIG. 3 is output as an external data DAT_OUT in response to the read clock signal CLK_RD.

In the embodiment, the data DATA is output after two clocks of the read clock signal CLK_RD from the activation of the data control signal POUT_CL3. This may be different according to a design of the semiconductor memory device. That is, if the data DATA is output after one clock from the activation of the data control signal POUT_CL3 according to the CAS latency CL, the activation period of the sampling control signal may be reduced accordingly, and thus a toggling period of the read clock signal CLK_RD may also be reduced. In addition, as a burst length is set to 8 herein, eight data DATA are output in response to the read clock signal CLK_RD. If the burst length BL is set to 4, the activation period of the sampling control signal may be reduced accordingly, and thus the toggling period of the read clock signal CLK_RD may also be reduced. Therefore, the read clock signal CLK_RD in accordance with the embodiment can toggle only during a period required to output the data.

Meanwhile, recently, as a frequency of the clock signal increases, one cycle tCK has been reduced to 1 ns or below. Therefore, the sampling of the read clock signal CLK_RD at a desired timing becomes difficult.

FIG. 5 is a timing diagram where margins of the signals shown in FIG. 4 are taken into account.

FIG. 5 shows waveforms of a data clock signal WCLK/2, a margin output enable signal OE_MG, a first timing control signal CTR_ENB, an output enable signal OE, a second timing control signal CTR_DISB, a sampling control signal CTR_SAMP, a read clock signal CLK_RD, a data control signal POUT_CL3, and an external data.

Comparing with FIG. 4, before the activation of the output enable signal OE to a logic high level, the margin output enable signal OE_MG is activated to a logic high level, and thereby the first timing control signal CTR_ENB is activated to a logic low level. Here, because an activation timing of the sampling control signal CTR_SAMP is determined by the first timing control signal CTR_ENB, the sampling control signal CTR_SAMP can have a longer activation period than that of FIG. 4. The second timing control signal CTR_DISB is activated to a logic low level according to the burst length BL in FIG. 3 to determine a deactivation timing of the sampling control signal CTR_SAMP. Therefore, the sampling control signal CTR_SAMP can have a longer activation period than that of FIG. 4, according to a design of the semiconductor memory device. As the sampling control signal CTR_SAMP has a longer activation period, a sufficient margin can be secured between signals, and thus a stable operation of the semiconductor memory device can be secured. That is, the periods of the sampling control signal CTR_SAMP can be determined by the first and second timing control signals CTR_ENB and CTR_DISB.

For reference, the margin output enable signal OE_MG is activated at −6 clocks from the CAS latency CL, and the second timing control signal CTR_DISB is activated at +2 clocks from the CAS latency CL. This may be different according to a design of the semiconductor memory device, and the activation period of the sampling control signal CTR_SAMP may also be different according to a design of the semiconductor memory device. A toggling period of the read clock signal CLK_RD may also be different according to the activation period of the sampling control signal CTR_SAMP. In accordance with the embodiment, the read clock signal CLK_RD can toggle during the period required to output the data DATA, while maintaining a predetermined level after the period. Therefore, power consumption due to the toggling of the read clock signal CLK_RD can be minimized.

Hereinafter, the semiconductor memory device to which the timing diagram of FIG. 5 is applied will be mainly described for a convenience of illustration.

Figure 6:
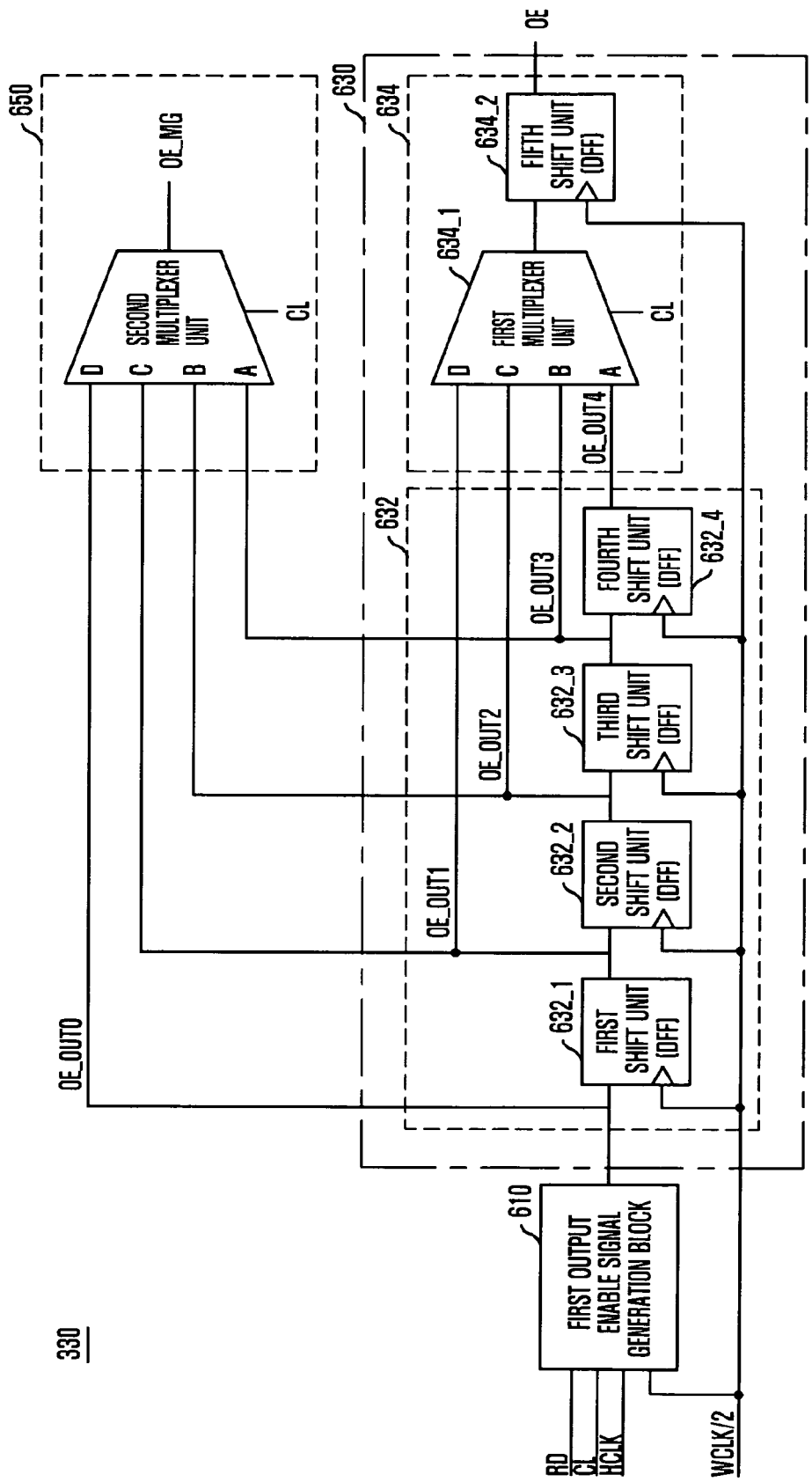
FIG. 6 is a block diagram of an output enable signal generation circuit shown in FIG. 3.

FIG. 6 is a block diagram of an output enable signal generation circuit 330 shown in FIG. 3.

Referring to FIGS. 5 and 6, the output enable signal generation circuit includes a first output enable signal generation block 610, a second output enable signal generation block 630, and a margin output enable signal generation block 650.

The first output enable signal generation block 610 receives a CAS latency CL, a host clock signal HCLK and a data clock signal WCLK/2 to generate a source output enable signal OE_OUT0. The source output enable signal OE_OUT0 synchronizes a read command RD to the data clock signal WCLK/2, and is activated at a timing according to the CAS latency CL. For reference, the source output enable signal OE_OUT0 output from the first output enable signal generation block 610 may be an output enable signal according to a CAS latency CL of a low operation frequency. Because configurations and circuit operation of the first output enable signal generation block 610 is obvious to those skilled in the art, detailed descriptions thereof will be omitted herein.

The second output enable signal generation block 630 receives the source output enable signal OE_OUT0 to generate an output enable signal OE according to a CAS latency CL of a high operation frequency. To this end, the second output enable signal generation block 630 may include a plurality of shift units 632 and an output enable signal output unit 634.

The plurality of shift units 632 shift the source output enable signal OE_OUT0 in response to the data clock signal WCLK/2. To this end, the plurality of shift units 632 may include first to fourth shift units 632_1, 632_2, 632_3 and 632_4. Each of the first to fourth shift units 632_1, 632_2, 632_3 and 632_4 may include a general D flip-flop. In this case, the D flip-flop outputs an input signal in response to a rising edge or a falling edge of the clock signal.

As such, the first shift unit 632_1 receives the source output enable signal OE_OUT0 to output a first output signal OE_OUT1 in response to the data clock signal WCLK/2. The second shift unit 632_2 receives the first output signal OE_OUT1 to output a second output signal OE_OUT2 in response to the data clock signal WCLK/2. The third shift unit 632_3 receives the second output signal OE_OUT2 to output a third output signal OE_OUT3 in response to the data clock signal WCLK/2. The fourth shift unit 632_4 receives the third output signal OE_OUT3 to output a fourth output signal OE_OUT4 in response to the data clock signal WCLK/2.

The output enable signal output unit 634 receives the first to fourth output signals OE_OUT1, OE_OUT2, OE_OUT3 and OE_OUT4 to output one of them according to the CAS latency CL. To this end, the output enable signal output unit 634 may include a first multiplexer unit 634_1 and a fifth shift unit 634_2.

The first multiplexer unit 634_1 receives the first to fourth output signals OE_OUT1, OE_OUT2, OE_OUT3 and OE_OUT4 to output one of them according to the CAS latency CL. To this end, the first multiplexer unit 634_1 may include a typical multiplexer. In this case, the multiplexer may output one of a plurality of input signals in response to a select signal.

The fifth shift unit 634_2 receives an output signal of the first multiplexer unit 634_1 to output the output enable signal OE in synchronization with the data clock signal WCLK/2. To this end, the fifth shift unit 634_2 may include a typical D flip-flop like the first to fourth shift units 632_1, 632_2, 632_3 and 632_4. For reference, such configurations of the output enable signal output unit 634 allows that skew caused by the first multiplexer unit and generation of the output enable signal OE according to the CAS latency CL are not reflected in the output enable signal OE.

The margin output enable signal generation block 650 receives the source output enable signal OE_OUT0, the first to third output signals OE_OUT1, OE_OUT2 and OE_OUT3 to output one of them as a margin output enable signal OE_MG according to the CAS latency CL. To this end, the margin output enable signal generation block 650 includes a second multiplexer unit. The second multiplexer unit may include a typical multiplexer like the first multiplexer unit 634_1. Preferably, the margin output enable signal OE_MG is activated prior to the activation of the output enable signal OE, which will be described later.

Hereinafter, a simple operation of the semiconductor memory device will be described.

For convenience of illustration, it will be assumed that the first multiplexer unit 634_1 in the second output enable signal generation block 630 and the second multiplexer unit in the margin output enable signal generation unit 650 outputs a signal applied to an input terminal C according to the CAS latency CL.

The plurality of shift units 632 shift the source output enable signal OE_OUT0 activated in response to the data clock signal WCLK/2, to activate the first output signal OE_OUT1. The margin output enable signal generation block 650 outputs the first output signal OE_OUT1 as a margin output enable signal OE_MG. Thereafter, the first multiplexer unit 634_1 outputs the activated second output signal OE_OUT2, and the fifth shift unit 634_2 outputs the second output signal OE_OUT2 as the output enable signal OE in response to the data clock signal WCLK/2. The shift operations are performed using a clock based on the data clock signal WCLK/2. That is, the output enable signal OE is activated two clocks after the activation of the margin output enable signal OE_MG.

In the embodiment, the margin output enable signal OE_MG and the output enable signal OE are separated by two clocks. However, this may be different according to a design of the semiconductor memory device. Preferably, the margin output enable signal OE_MG corresponding to the activation timing of the sampling control signal CTR_SAMP is activated prior to the activation of the output enable signal OE. Consequently, it is possible to secure a margin corresponding to a time interval between the activation of the margin output enable signal OE_MG and the activation of the output enable signal OE.

Figure 7:
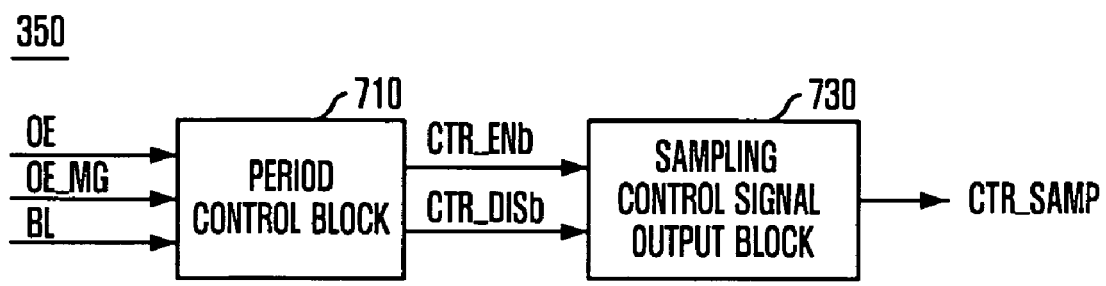
FIG. 7 is a block diagram of a sampling control signal generation circuit shown in FIG. 3.

FIG. 7 is a block diagram of the sampling control signal generation circuit 350 shown in FIG. 3. The sampling control signal generation circuit 350 to which the timing diagram of FIG. 5 is applied will be mainly described for convenience of illustration. That is, the sampling control signal generation circuit 350 receives the margin output enable signal OE_MG.

Referring to FIG. 7, the sampling control signal generation circuit 350 may include a period control block 710 and a sampling control signal output block 730.

The period control block 710 generates first and second timing control signals CTR_ENB and CTR_DISB in response to an output enable signal OE, a margin output enable signal OE_MG, and a burst length BL. The first timing control signal CTR_ENB is activated in response to the margin output enable signal OE_MG, and the second timing control signal CTR_DISB is activated according to the burst length BL which has information about the timing to terminate data output. When a margin is not considered, the period control block 710 generates the first timing control signal CTR_ENB in response to the output enable signal OE instead of the margin output enable signal OE_MG, and generates the second timing control signal CTR_DISB according to the burst length BL.

Before describing the sampling control signal output block 730, more detailed description of the period control block 710 will be given below.

Figure 8:
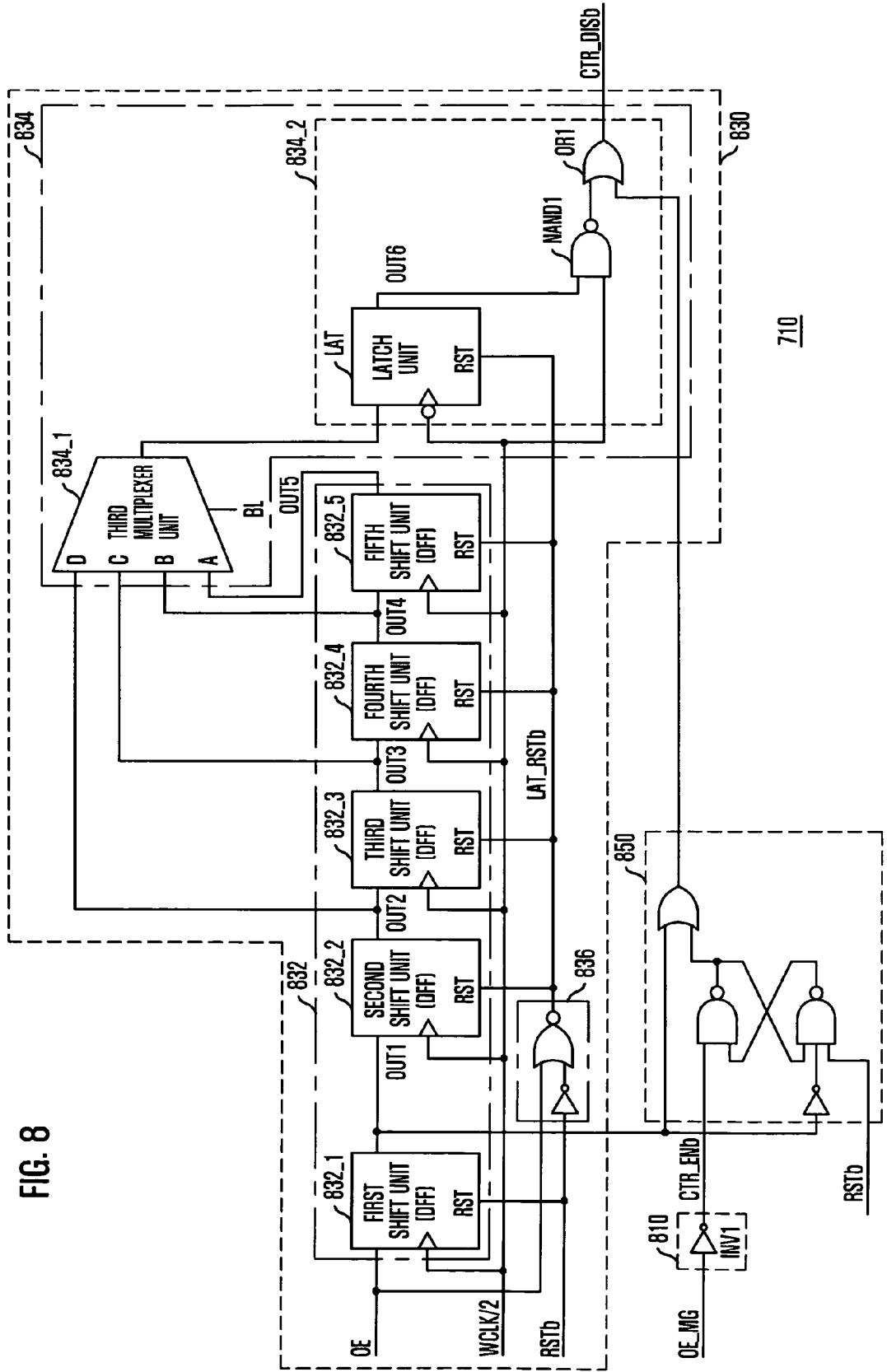
FIG. 8 is a block diagram of a period control block shown in FIG. 7.

FIG. 8 is a block diagram of the period control block 710 shown in FIG. 7.

Referring to FIG. 8, the period control block 710 may include a first signal generation unit 810, a second signal generation unit 830, and a stabilization unit 850.

The first signal generation unit 810 may include a first inverter INV1 configured to invert the margin output enable signal OE_MG to generate the first timing control signal CTR_ENB.

The second signal generation unit receives the output enable signal OE to generate the second timing control signal CTR_DISB according to the burst length BL. To this end, the second signal generation unit 830 may include a plurality of shift units 832, a signal output unit 834, and a reset unit 836.

The plurality of shift units 832 shift the output enable signal OE in response to the data clock signal WCLK/2. To this end, the plurality of shift units may include first to fifth shift units 832_1, 832_2, 832_3, 832_4 and 832_5. Each of the first to fifth shift units 832_1, 832_2, 832_3, 832_4 and 832_5 may include a typical D flip-flop. In this case, the D flip-flop outputs an input signal in response to a rising edge or a falling edge of the clock signal.

As such, the first shift unit 832_1 receives the output enable signal OE to output a first output signal OUT1 in response to the data clock signal WCLK/2. The second shift unit 832_2 receives the first output signal OUT1 to output a second output signal OUT2 in response to the data clock signal WCLK/2. The third shift unit 832_3 receives the second output signal OUT2 to output a third output signal OUT3 in response to the data clock signal WCLK/2. The fourth shift unit 832_4 receives the third output signal OUT3 to output a fourth output signal OUT4 in response to the data clock signal WCLK/2. The fifth shift unit 832_5 receives the fourth output signal OUT4 to output a fifth output signal OUT5 in response to the data clock signal WCLK/2. Here, the first shift unit 832_1 may be reset in response to a reset signal RSTB.

The signal output unit 834 receives the second to fifth output signals OUT2, OUT3, OUT4 and OUT5 to output one of them as the second timing control signal CTR_DISB according to the burst length BL. To this end, the signal output unit 834 may include a third multiplexer unit 834_1 and a synchronization unit 834_2.

The third multiplexer unit 834_1 outputs one of the second to fifth output signals OUT2, OUT3, OUT4 and OUT5 according to the burst length. To this end, the third multiplexer unit 834_1 may include a typical multiplexer. In the embodiment, the third multiplexer unit 834_1 receives the second to fifth output signals OUT2, OUT3, OUT4 and OUT5. However, this may be different according to a design of the semiconductor memory device. For example, if the third multiplexer unit 834_1 outputs the fourth output signal OUT4 when the burst length BL is 8, the third multiplexer unit 834_1 preferably outputs the third output signal OUT3 when the burst length BL is 4.

The synchronization unit 834_2 may include a latch unit LAT, a first NAND gate NAND1, and a first OR gate OR1.

The latch unit LAT may include a typical latch. The latch unit LAT latches an output signal of the third multiplexer unit 834_1 in response to the data clock signal WCLK/2. The first NAND gate NAND1 performs a NAND operation on the data clock signal WCLK/2 and an output signal of the latch unit LAT to activate the second timing control signal CTR_DISB. The second timing control signal CTR_DISB is activated to a logic low level when the data clock signal WCLK/2 has a logic high level and the output signal of the latch unit LAT has a logic high level. The first OR gate OR1 performs an OR operation on an output signal of the first NAND gate NAND1 and an output signal of the stabilization unit 850 to generate the second timing control signal CTR_DISB.

The reset unit 836 receives the reset signal RSTB and the output enable signal OE to reset the second to fifth shift units 832_2, 832_3, 832_4 and 832_5, and the latch unit LAT. An output signal LAT_RSTB of the reset unit 836 is applied to reset terminals RST of the second to fifth shift units 832_2, 832_3, 832_4 and 832_5 and the latch unit LAT to control reset operations of the units. That is, the reset operations of the second to fifth shift units 832_2, 832_3, 832_4 and 832_5 and the latch unit LAT are performed by the output enable signal OE as well as by the reset signal RSTB. The reset operation by the output enable signal OE is related to successively applied read commands, which will be described later.

The first and second timing control signals CTR_ENB and CTR_DISB are used to determine an activation period of the sampling control signal CTR_SAMP. The sampling control signal CTR_SAMP is activated in response to the first timing control signal CTR_ENB, and deactivated in response to the second timing control signal CTR_DISB. Based on this, a simple operation of the period control clock 710 of FIG. 8 will be described below.

In response to the margin output enable signal OE_MG, the first timing control signal CTR_ENB is activated. Thereafter, the output enable signal OE is activated and shifted by the first to fifth shift units 832_1, 832_2, 832_3, 832_4 and 832_5. Here, one of the second to fifth output signals OUT2, OUT3, OUT4 and OUT5 is output according to the burst length, and then synchronized to the data clock signal WCLK/2 in the latch unit LAT to activate the second timing control signal CTR_DISB.

Meanwhile, if the read commands are successively applied, the output enable signal OE activated in response to the read command is applied to the reset unit 836 to reset the second to fifth shift units 832_2, 832_3, 832_4 and 832_5. As a result, the output enable signal OE transferred through the second to fifth shift units 832_2, 832_3, 832_4 and 832_5 is reset. The period control clock 710 may also include the stabilization unit 850 to prevent the second timing control signal CTR_DISB from being activated to a logic low level.

The stabilization unit 850 receives the first output signal OUT1 corresponding to the output enable signal OE or the first timing control signal CTR_ENB corresponding to the margin output enable signal OE_MG to deactivate the second timing control signal CTR_DISB. The stabilization unit 850 can maintain the second timing control signal CTR_DISB to a logic high level. That is, if the read command RD is input again before the second timing control signal CTR_DISB is activated to a logic low level, the margin output enable signal OE_MG is activated to set the stabilization unit 850. Consequently, the stabilization unit 850 maintains the second timing control signal CTR_DISB to a logic high level. Here, the first output signal OUT1 serves as another safety element for maintaining the second timing control signal CTR_DISB to a logic high level. The first output signal OUT1 serves to reset the stabilization unit 850.

Figure 9:
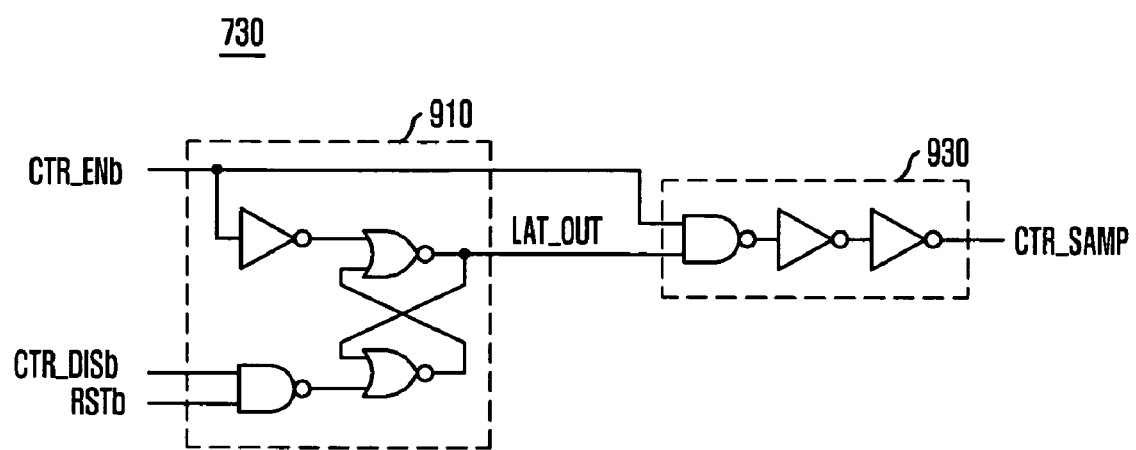
FIG. 9 is a circuit diagram of a sampling control signal output block shown in FIG. 7.

FIG. 9 is a circuit diagram of the sampling control signal output block 730 shown in FIG. 7.

Referring to FIG. 9, the sampling control signal output block 730 outputs the sampling control signal CTR_SAMP activated during a period that is set by the first and second timing control signals CTR_ENB and CTR_DISB. To this end, the sampling control signal output block 730 may include a latch unit 910 and an output unit 930.

An output signal LAT_OUT of the latch unit 910 has a logic low level in response to the first timing control signal CTR_ENB, and has a logic high level in response to the second timing control signal CTR_DISB. The output unit 930 receives the output signal LAT_OUT of the latch unit 910 to generate the sampling control signal CTR_SAMP. In addition, because the first timing control signal CTR_ENB is generated by the margin output enable signal OE_MG taking the margin into account, the output unit 930 may also receive the first timing control signal CTR_ENB directly, to generate the sampling control signal CTR_SAMP.

That is, the output unit 930 receives the first timing control signal CTR_ENB or the output signal LAT_OUT of the latch unit 910 to generate the sampling control signal CTR_SAMP.

Figure 10:
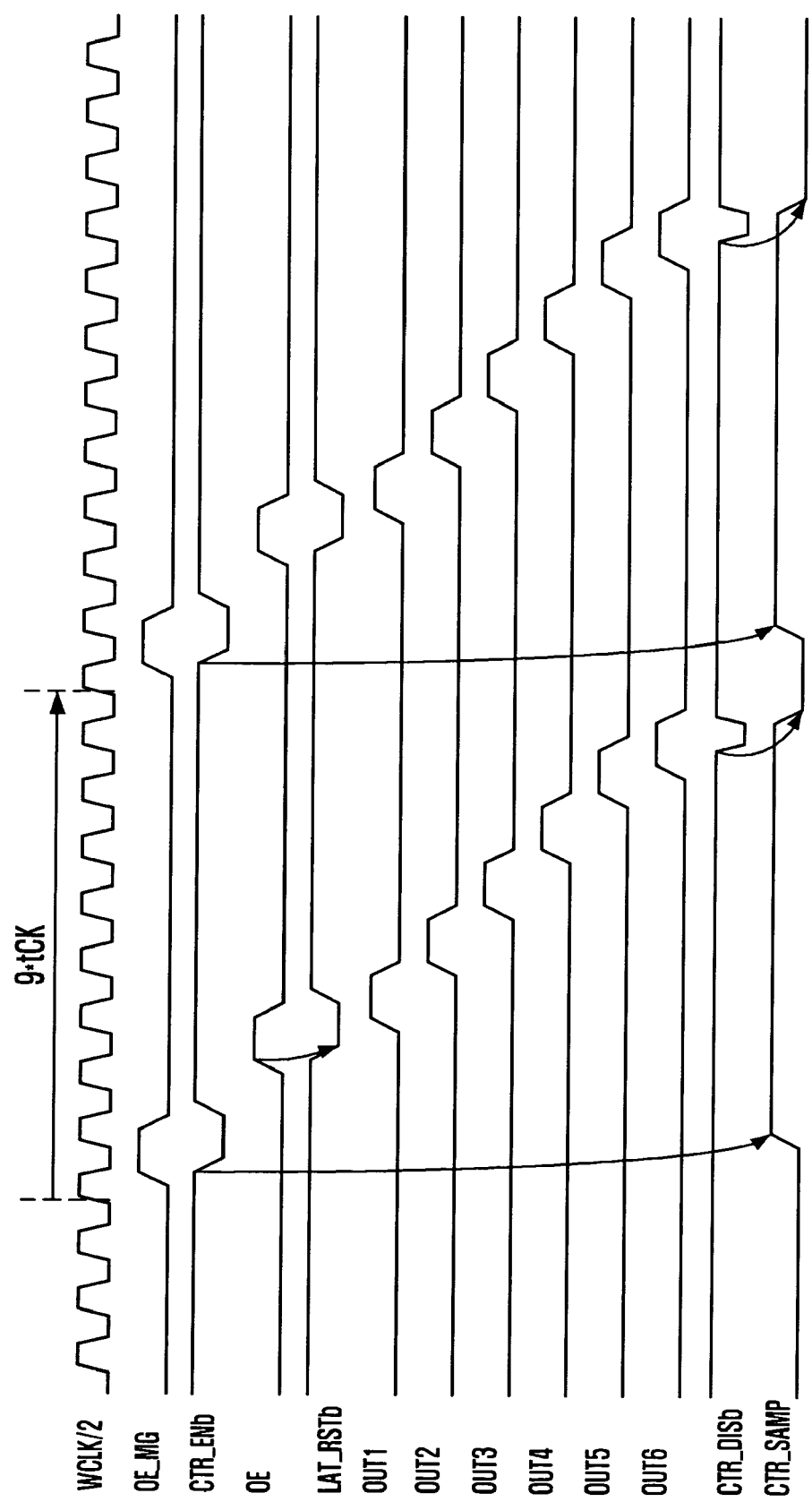
FIGS. 10 and 11 are timing diagrams illustrating waveforms of signals shown in FIGS. 7 to 9 during a read operation of a semiconductor memory device in accordance with embodiments of the present invention.
Figure 11:
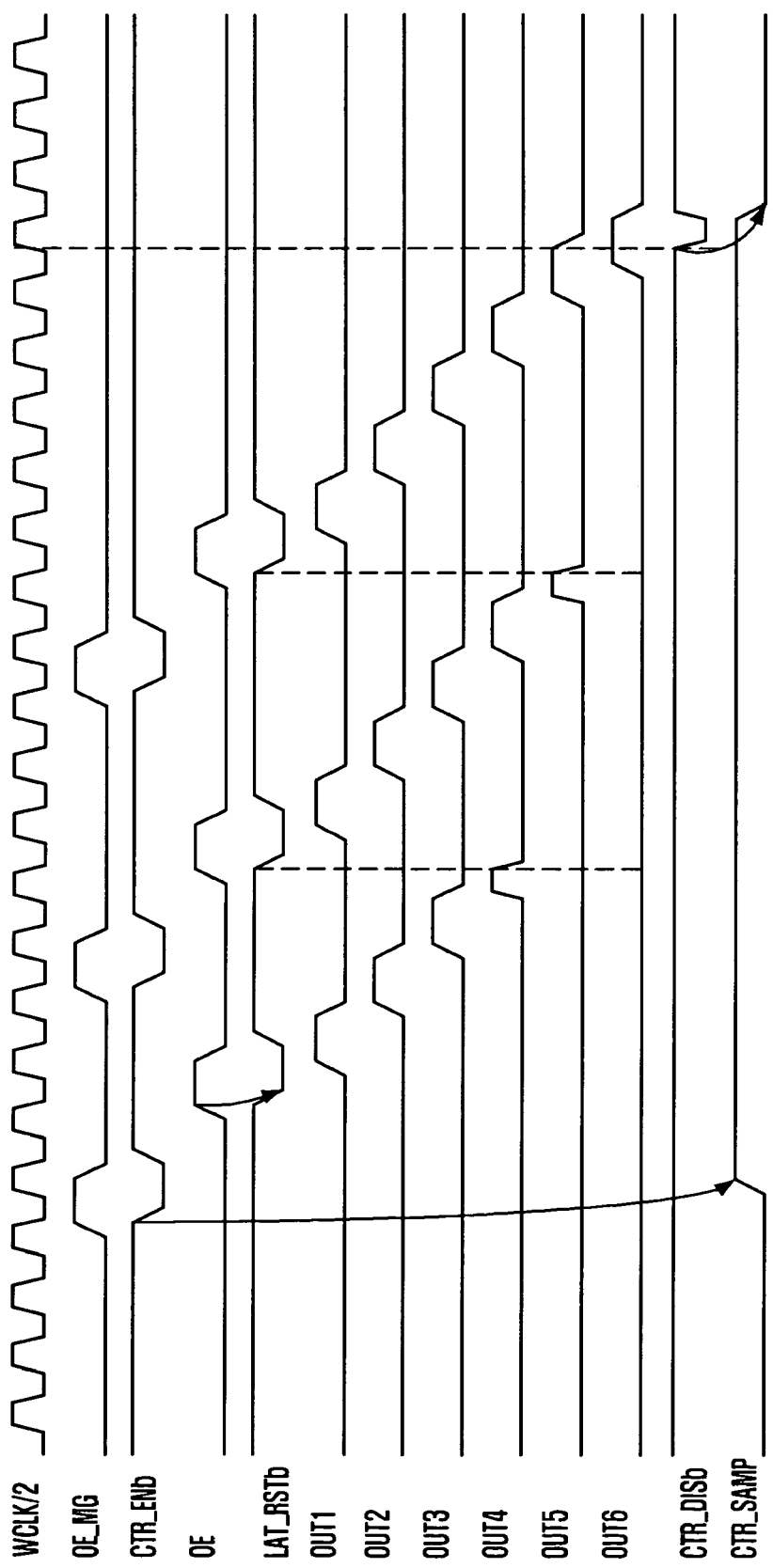

FIGS. 10 and 11 are timing diagrams illustrating waveforms of signals shown in FIGS. 7 to 9 during a read operation of a semiconductor memory device in accordance with embodiments of the present invention. FIG. 10 illustrates waveforms of the signals during the read operation when the read commands RD are input with a sufficient time interval of, for example, 9tCK therebetween. FIG. 11 illustrates waveforms of the signals during the read operation when the read commands RD are input successively.

Referring to FIGS. 7 to 10, as margin output enable signal OE_MG is activated to activate the first timing control signal CTR_ENB to a logic low level, the sampling control signal output block 730 in FIG. 9 activates the sampling control signal CTR_SAMP to a logic high level. That is, the activation timing of the sampling control signal CTR_SAMP is determined by the first timing control signal CTR_ENB.

Thereafter, the output enable signal OE is activated and shifted by the plurality of shift units 832 in FIG. 8. For convenience of illustration, it will be assumed that the third multiplexer unit 834_1 in FIG. 8 outputs the fifth output signal OUT5 when the burst length BL is set to 8. The fifth output signal OUT5 is synchronized to a falling edge of the data clock signal WCLK/2 in the synchronization unit 834_2 to generate the sixth output signal OUT6. When the sixth output signal OUT6 and the data clock signal WCLK/2 both have a logic high level to activate the second timing control signal CTR_DISB to a logic low level, the sampling control signal output block 730 in FIG. 9 deactivates the sampling control signal CTR_SAMP to a logic low level. That is, the deactivation timing of the sampling control signal CTR_SAMP is determined by the second timing control signal CTR_DISB.

If the read command is input after a sufficient time interval, the above operations are performed again to generate the sampling control signal CTR_SAMP which is activated only during a predetermined period. Then the read clock signal CLK_RD toggles according to the sampling control signal CTR_SAMP.

FIG. 11 illustrates waveforms of the signals during the read operation when the read commands RD are input successively. In this case, the second timing control signal CTR_DISB is not activated to a logic low level. That is, the second timing control signal CTR_DISB is not activated to a logic low level by the reset unit 836 and the stabilization unit 850 in FIG. 8, and thus the sampling control signal CTR_SAMP is not deactivated to a logic low level. Accordingly, when the read commands RD are applied successively, the activation period of the sampling control signal CTR_SAMP becomes longer correspondingly, and thus the toggling period of the read clock signal CLK_RD also becomes longer correspondingly. As a result, the semiconductor memory device can operate stably even if the read commands are applied successively.

As described above, by controlling the read clock signal CLK_RD to toggle only during a desired period, it is possible to minimize the power consumption of the semiconductor memory device. That is, by activating the read clock signal only during the period required to output data, it is possible to prevent unnecessary power consumption due to the toggling of the read clock signal during an unnecessary period.

As described above, by generating the read clock signal that toggles only during the period required to output data, power consumption can be reduced while performing a stable data read operation.

While the present invention has been described with respect to the specific embodiments, it will be apparent to those skilled in the art that various changes and modifications may be made without departing from the spirit and scope of the invention as defined in the following claims.

For example, the location and kind of the logic gate and transistor may be different from those described in the examples according to a polarity of an input signal.

In addition, although the case where the sampled read clock signal is used to output data is illustrated in the embodiments, the present invention is not limited thereto. For example, the present invention is also applicable to reducing power consumption due to a toggling clock signal, and to reducing power consumption due to a clock signal toggling only during a certain period.

What is claimed is:

1. A semiconductor memory device, comprising:
   an output enable signal generator configured to synchronize a read command to a data clock signal to generate an output enable signal according to a CAS latency;
   a sampling control signal generator configured to generate a sampling control signal that is activated during a period corresponding to an activation timing of the output enable signal and an end timing of data output;
   a read clock signal generator configured to sample the data clock signal in response to the sampling control signal to generate a read clock signal; and
   a data output circuit configured to output data according to the read clock signal.

2. The semiconductor memory device as recited in claim 1, wherein the sampling control signal is activated in response to the activation timing of the output enable signal and deactivated in response to the end timing of the data output.

3. The semiconductor memory device as recited in claim 1, wherein the sampling control signal generator comprises:
   a period control block configured to generate a first timing control signal in response to the activation timing of the output enable signal and generate a second timing control signal in response to the end timing of the data output; and
   a sampling control signal output block configured to output the sampling control signal that is activated during a period set according to the first and second timing control signals.

4. The semiconductor memory device as recited in claim 1, wherein the end timing of the data output is set according to a burst length.

5. The semiconductor memory device as recited in claim 1, wherein the output enable signal generator comprises:
   a first output enable signal generation block configured to generate a source output enable signal according to a portion of the CAS latency; and
   a second output enable signal generation block configured to receive the source output enable signal to generate the output enable signal according to another portion of the CAS latency.

6. The semiconductor memory device as recited in claim 5, wherein the second output enable signal generation block comprises:
   a plurality of shift units configured to shift the source output enable signal in response to the data clock signal; and
   an output enable signal output unit configured to output one of output signals of the plurality of shift units as the output enable signal according to the CAS latency.

7. The semiconductor memory device as recited in claim 6, wherein the output enable signal output unit comprises:
   a multiplexer unit configured to output the one of the output signals of the plurality of shift units according to the CAS latency; and
   a synchronization unit configured to synchronize an output signal of the multiplexer unit to the data clock signal to output the output enable signal.

8. The semiconductor memory device as recited in claim 7, further comprising a margin output enable signal generation block configured to output one of the output signals of the plurality of shift units according to the CAS latency as a margin output enable signal.

9. The semiconductor memory device as recited in claim 8, wherein the margin output enable signal is activated prior to an activation of the output enable signal.

10. The semiconductor memory device as recited in claim 8, wherein a first timing control signal is activated in response to the margin output enable signal.

11. The semiconductor memory device as recited in claim 3, wherein the period control block comprises:
    a first signal generation unit configured to receive the output enable signal to generate the first timing control signal; and
    a second signal generation unit configured to generate the second timing control signal according to the output enable signal and the burst length.

12. The semiconductor memory device as recited in claim 11, wherein the second signal generation unit comprises:
    a plurality of shift units configured to shift the output enable signal in response to the data clock signal;
    a signal output unit configured to output one of output signals of the plurality of shift units as the second timing control signal according to the burst length; and
    a reset unit configured to reset the plurality of shift units according to the successively input read commands.

13. The semiconductor memory device as recited in claim 12, wherein the signal output unit comprises:
    a multiplexer unit configured to output the one of the output signals of the plurality of shift units according to the burst length; and
    a synchronization unit configured to synchronize an output signal of the multiplexer unit to the data clock signal to output the second timing control signal.

14. The semiconductor memory device as recited in claim 8, further comprising a stabilization unit configured to deactivate a second timing control signal according to the output enable signal or the margin output enable signal.

15. The semiconductor memory device as recited in claim 1, wherein the read clock signal generator generates the read clock signal that toggles only during an activation period of the sampling control signal.

16. The semiconductor memory device as recited in claim 1, further comprising a frequency dividing circuit configured to divide an external clock signal to generate the data clock signal.

17. The semiconductor memory device as recited in claim 4, wherein the CAS latency and the burst length are provided by a mode register set.

18. An operation method of a semiconductor memory device comprising:
  generating a sampling control signal that is activated during a period corresponding to an activation timing of an output enable signal and an end timing of data output;
  sampling a data clock signal in response to the sampling control signal;
  outputting data according to the sampled data clock signal; and
  synchronizing a read command to the data clock signal to generate the output enable signal according to a CAS latency.

19. The operation method as recited in claim 18, wherein the sampling control signal is activated in response to the activation timing of the output enable signal and deactivated in response to the end timing of the data output.

20. The operation method as recited in claim 18, wherein the generating of the sampling control signal comprises:
  generating a first timing control signal in response to the activation timing of the output enable signal;
  generating a second timing control signal in response to the end timing of the data output; and
  outputting the sampling control signal that is activated during a period set according to the first and second timing control signals.

21. The operation method as recited in claim 18, wherein the end timing of the data output is set according to a burst length.

22. The operation method as recited in claim 18, wherein the synchronizing of the read command comprises:
  generating a source output enable signal according to a portion of the CAS latency; and
  shifting the source output enable signal to generate the output enable signal according to another portion of the CAS latency.

23. The operation method as recited in claim 22, further comprising outputting one of a plurality of signals shifted from the source output enable signal as a margin output enable signal.

24. The operation method as recited in claim 23, wherein the margin output enable signal is activated prior to an activation of the output enable signal.

25. The operation method as recited in claim 23, wherein a first timing control signal is activated in response to the margin output enable signal.

26. The operation method as recited in claim 20, wherein the generating of the second timing control signal comprises:
  outputting one of a plurality of signals shifted from the output enable signal as the second timing control signal according to a burst length; and
  deactivating the second timing control signal according to the successively activated output enable signal.

* * * * *